(12) United States Patent
Harley et al.

(10) Patent No.: US 9,324,613 B2
(45) Date of Patent: Apr. 26, 2016

(54) METHOD FOR FORMING THROUGH SUBSTRATE VIAS WITH TETHERS

(71) Applicant: Innovative Micro Technology, Goleta, CA (US)

(72) Inventors: John C Harley, Santa Barbara, CA (US); Zhimin J. Yao, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 14/619,068

(22) Filed: Feb. 11, 2015

(65) Prior Publication Data
US 2016/0093531 A1 Mar. 31, 2016

Related U.S. Application Data

(63) Continuation-in-part of application No. 14/499,287, filed on Sep. 29, 2014.

(51) Int. Cl.
| | |
|---|---|
| H01L 21/768 | (2006.01) |
| H01L 21/84 | (2006.01) |
| B81C 1/00 | (2006.01) |
| H01L 21/288 | (2006.01) |
| H01L 21/02 | (2006.01) |
| H01L 21/321 | (2006.01) |

(52) U.S. Cl.
CPC ...... *H01L 21/76898* (2013.01); *B81C 1/00301* (2013.01); *H01L 21/02233* (2013.01); *H01L 21/02255* (2013.01); *H01L 21/2885* (2013.01); *H01L 21/3212* (2013.01); *H01L 21/7684* (2013.01); *H01L 21/76873* (2013.01); *H01L 21/76879* (2013.01); *H01L 21/76882* (2013.01); *H01L 21/84* (2013.01)

(58) Field of Classification Search
CPC ..... H01L 23/48; H01L 23/488; H01L 23/482; H01L 23/481; H01L 23/5226; H01L 23/498; H01L 25/0657; H01L 29/40; H01L 29/41; H01L 21/76898; H01L 21/76879; H01L 21/76843; H01L 21/4763; H01L 21/76877; H01L 21/76802; H01L 21/73838; H01L 21/20
USPC .................. 438/667, 629, 637, 668, 672, 675
See application file for complete search history.

(56) References Cited

U.S. PATENT DOCUMENTS

| | | | | |
|---|---|---|---|---|
| 6,700,175 B1 * | 3/2004 | Kodama | ............... | H01L 29/0634 257/302 |
| 6,933,205 B2 * | 8/2005 | Matsuo | ................. | H01L 23/481 257/E23.011 |
| 7,528,691 B2 | 5/2009 | Wallis et al. | | |
| 7,864,006 B2 | 1/2011 | Foster et al. | | |
| 7,893,798 B2 | 2/2011 | Foster et al. | | |
| 2005/0037608 A1 * | 2/2005 | Andricacos | ......... | H01L 21/2885 438/637 |
| 2005/0121768 A1 * | 6/2005 | Edelstein | .............. | H01L 21/486 257/698 |

* cited by examiner

*Primary Examiner* — Chuong A Luu
(74) *Attorney, Agent, or Firm* — Jacquelin K. Spong

(57) ABSTRACT

A method for forming through silicon vias (TSVs) in a silicon substrate is disclosed. The method involves forming a silicon post as an substantially continuous annulus in a first side of a silicon substrate, removing material from an opposite side to the level of the substantially continuous annulus, removing the silicon post and replacing it with a metal material to form a metal via extending through the thickness of the substrate. The substantially continuous annulus may be interrupted by at least one tether which connects the silicon post to the silicon substrate. The tether may be formed of a thing isthmus of silicon, or some suitable insulating material.

23 Claims, 20 Drawing Sheets

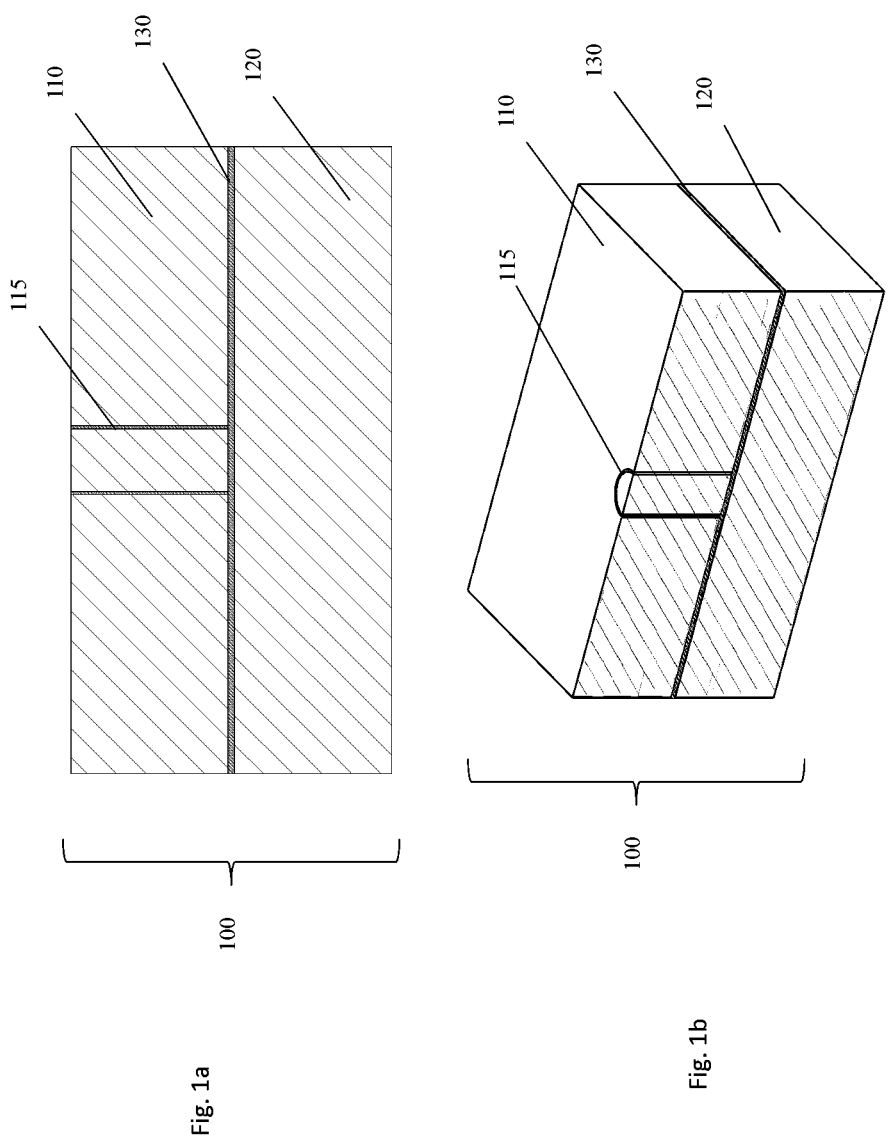

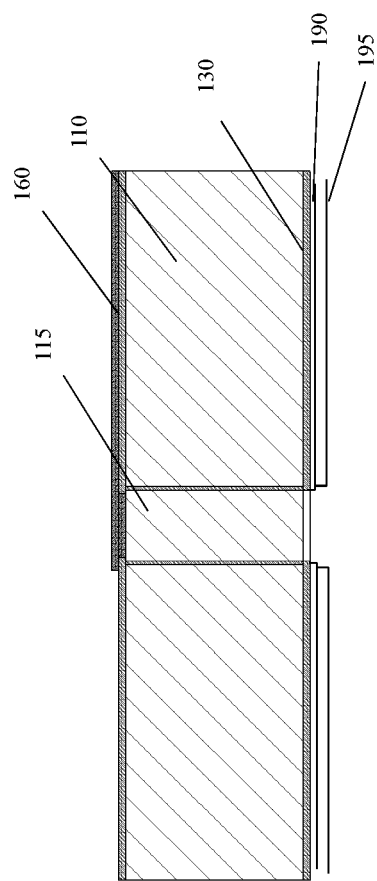
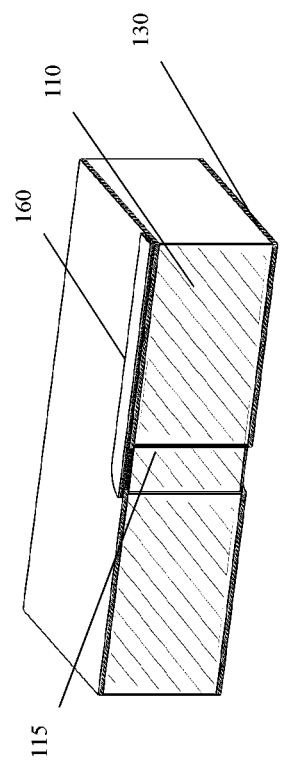
Fig. 4a
Fig. 4b

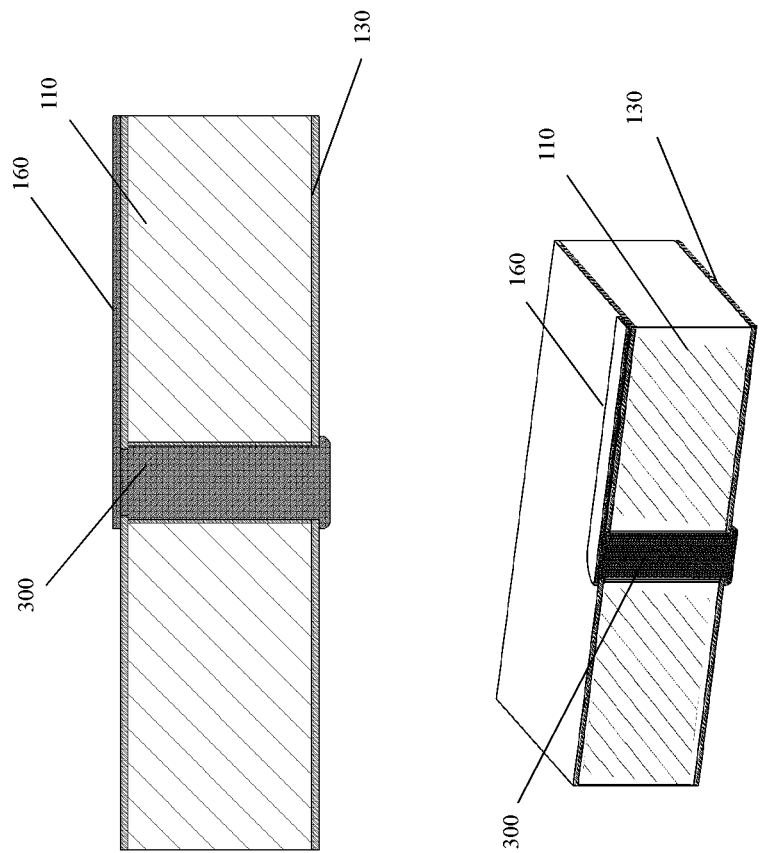

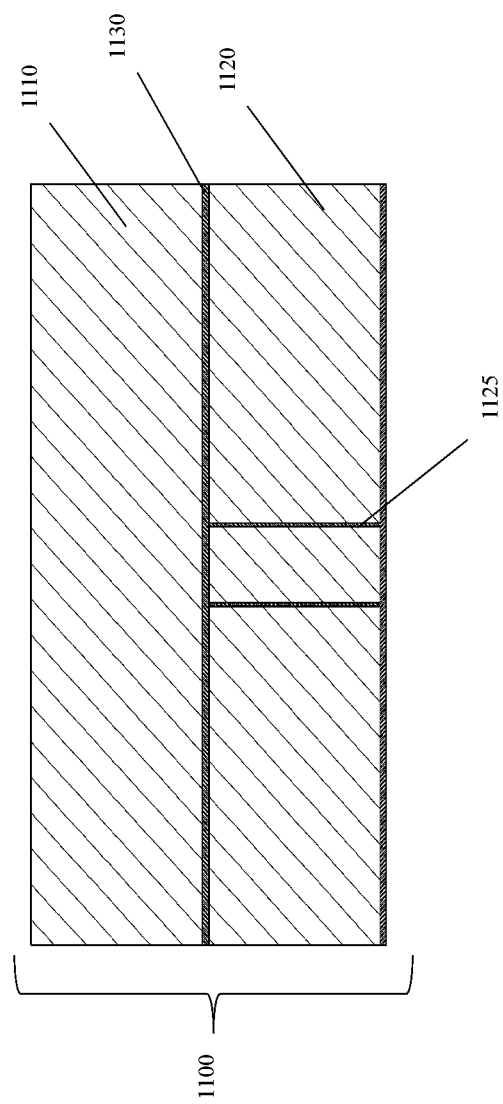

METHOD FOR FORMING THROUGH SUBSTRATE VIAS WITH TETHERS

CROSS REFERENCE TO RELATED APPLICATIONS

This US Patent Application is a continuation-in-part of U.S. patent application Ser. No. 14/499,287, filed Sep. 29, 2014, which is incorporated by reference herein in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to integrated circuit and microelectromechanical systems (MEMS) devices. More particularly, this invention relates to the formation of vias in wafers on which the integrated circuits and MEMS devices may be fabricated.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. One example of a MEMS device is a microfabricated cantilevered beam, which may be used to switch electrical signals. Because of its small size and fragile structure, the movable cantilever may be enclosed in a cavity to protect it and to allow its operation in an evacuated environment. Therefore, upon fabrication of the moveable structure on a wafer, (device wafer) the device wafer may be mated with a lid wafer, in which depressions have been formed to allow clearance for the structure and its movement. To maintain the vacuum over the lifetime of the device, a getter material may also be enclosed in the device cavity upon sealing the lid wafer against the device wafer.

In order to control such a microfabricated switch, electrical access must be provided that allows power and signals to be transmitted to and from the switch. Vias are typically formed in at least one of the wafers to provide this access. If the switch is for high frequency signals, it may also be important to design the vias such that their electrical effects on the signals are minimized or at least known and understood.

Accordingly, electrical vias allow electrical access to electronic devices or microelectromechanical systems (MEMS) within a package or in a circuit. In order to continually reduce the cost of such packages and circuits, the packing density of devices within the packages and circuits has been continually increased. In order to support the increase in packing density, the pitch between electrical vias for the devices has also continued to shrink. As a consequence, there is a desire to form vias of increasingly large aspect ratio, that is, the vias are tending to become increasingly long and narrow. Furthermore increased packing density requires that the placement tolerance of the vias be tightly controlled, since increased placement uncertainty requires the center to center separation to be increased to avoid inadvertent shorting of adjacent vias.

Long, narrow vias are often created by plating a conductive material into a hole formed in a substrate. A hole may be created in a substrate by a directional material removal process such as reactive ion etching (RIE). A seed layer may then be deposited conformally over the etched surface, to provide a conductive layer to attract the plating material from the plating bath.

However, when using this approach, the plating material in the bath has a tendency to be increasingly depleted down the depth of the hole. This will cause the plating rate to be higher at the top and near zero at the bottom, resulting in pinch-off at the top. Since the aperture to the via has become closed, pinched off, the plating bath no longer circulates and the confined bath within the hole is exhausted of its plating species. Plating into the hole will then cease, and a void is formed beneath the point of closure of the via aperture. Since these problems worsen as the via becomes longer and narrower, this approach becomes increasingly difficult for long, narrow vias. Specialized bath chemistries have been developed that reduce the negative effects cited above, but they can be expensive and are difficult to control.

Another known method for making vias is to use an anisotropic etch to form the holes with sloping sidewalls, and to deposit the conductive material on the sloped walls of the holes. However, this method often results in conductive material having non-uniform thickness, and the heat conduction in the thin deposited layer is relatively poor. The aspect ratio must also remain near 1:2 (width=2× depth), further limiting the density of the vias.

Each of these approaches involves the removal of substrate material in the hole to form the via, and the filling of this hole with a conductive material. The hole may be made by, for example, the methods described above and then filled by electroplating gold or copper. Because of the aforementioned problems with these approaches, such methods generally limit the aspect ratio of the via formed, and are also applicable only to conductive substrates.

Therefore, a need exists for a methodology which can form vias with high aspect ratio, and in variety of material substrates.

SUMMARY

A method is described which can be used to make conductive vias in a silicon substrate with large aspect ratios. The method may be used with relatively high resistivity substrate materials, such as lightly doped silicon, but the via formed may nonetheless have excellent conductivity. The method may be particularly suitable for high frequency RF devices which need a relatively insulating substrate to minimize capacitive coupling losses. The method may be used to form vias which extend through substrates which are many hundreds of microns thick.

A feature of this process is that an annulus or trench may first be made in a suitable substrate. The annulus may be formed in a first side of the substrate, forming a post of substrate material surrounded by an annular void. The annular void may extend partially through the thickness of the substrate.

The annulus may optionally be a substantially continuous annulus, wherein the substantially continuous annulus may be interrupted by at least one silicon tether which couples the silicon post to the silicon substrate. There may be four such tethers positioned about 90 degrees apart, which attach the post to the substrate. In another alternative, the tether may be of a different material than the silicon substrate, and this added material may secure the post to the substrate. In another alternative, the annulus may be continuous or substantially continuous, but in either case, the circumscribed post is coupled to the substrate by at least one tether made of some deposited, insulating material. This deposited tether may be in addition to the silicon tether.

The walls of the annular void as well as other exposed surfaces may subsequently be oxidized. The oxide may then be removed from the top surface of the post of substrate material. A metal pattern may then be formed over the exposed top surface of the post of substrate material. The opposite side substrate material may then be removed to expose the annular void now filled with oxide material.

Finally, the post of substrate material may be etched away and replaced with a preferred metal material, for example, gold or copper having higher conductivity than the original substrate material. If the metal is plated, the surface may be planarized. Any remaining opposite side process steps may also be performed at this point, to complete fabrication of the device.

In one embodiment, the substrate is a silicon-on-insulator (SOI) substrate with a thin device layer, a buried oxide layer, and a thicker handle layer. The annulus may be formed through the thickness of the device layer, extending to the buried oxide. The handle layer may now be removed to complete the opposite side processing. In another embodiment, a regular, monolithic silicon substrate may be used. In this case, the annulus may be formed as a blind hole partially through the substrate from the first side. The opposite side may subsequently be ground or etched away.

In another embodiment, the substrate is again a silicon-on-insulator (SOI) substrate with a thin device layer, a buried oxide layer, and a thicker handle layer. This time, however, the annulus may be formed through the thickness of the handle layer, extending again to the buried oxide. After completion of device formation in the device layer, the device layer may be removed at the location down to the annulus on the opposing handle layer. The material of the post may then be replaced with a more suitable conducting material, if desired.

In yet another embodiment, a regular, monolithic silicon substrate may be used. In this case, the annulus may be formed as a blind hole partially through the substrate from the first side. The opposite side may subsequently be ground or etched away.

Numerous devices can make use of the systems and methods disclosed herein. In particular, RF switches benefit from the reduced capacitive coupling that an relatively insulative substrate surrounding the high conductivity vias can provide. High density vias formed in the relatively insulative substrate increase the density of devices which can be formed on a substrate, thereby reducing cost to manufacture. The performance of such devices may also be improved, in terms of insertion loss, distortion and isolation figures of merit.

Using the systems and methods to form a through silicon via (TSV) can be of use in a large number of devices. One such device is a capacitive switch, which carries high frequency RF signals to a junction. Another example is a low frequency DC switch which must carry large currents in an insulating substrate. A third example is a photovoltaic cell used for power generation. More generally, the TSVs may be used to provide a signal or voltage from the exterior of an enclosed device, to the enclosed device.

Accordingly, the method for forming a through substrate via may include forming a silicon post by forming a void in the shape of an annulus in a front side of a silicon substrate; oxidizing the silicon substrate and the void; removing the oxide over the annulus; forming a metal layer over the annulus; removing substrate material from the opposite side to reach the annulus; removing the silicon post to form a via void; and depositing a metal in the via void to form a through substrate via.

These and other features and advantages are described in, or are apparent from, the following detailed description.

BRIEF DESCRIPTION OF THE DRAWINGS

Various exemplary details are described with reference to the following figures, wherein:

FIG. 1a is a cross sectional view of a silicon substrate with an annulus formed therein; FIG. 1b is a perspective view of a silicon substrate with an annulus formed therein;

FIG. 4a is a cross sectional view of a silicon substrate with the annulus and metal pattern, and with handle layer removed; FIG. 4b is a perspective view of a silicon substrate with the annulus and metal pattern, and with handle layer removed;

FIG. 6a is a cross sectional view of a silicon substrate with the via void filled with a conductive material; FIG. 6b is a perspective view of a silicon substrate with the via void filled with a conductive material;

FIG. 8 is a cross sectional view of another embodiment of a silicon substrate with an annulus formed therein;

DETAILED DESCRIPTION

Figure 2A:
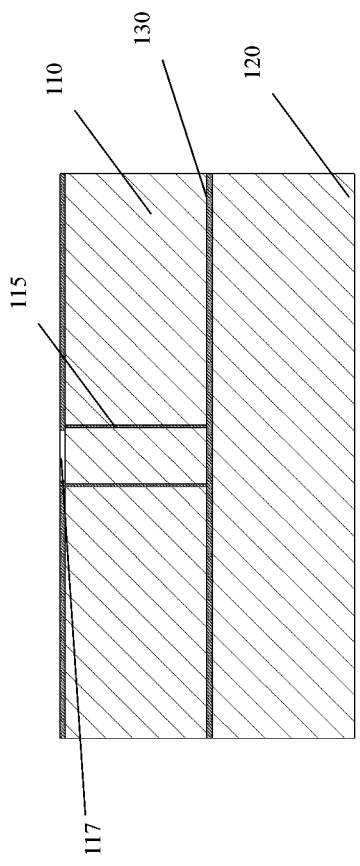
FIG. 2a is a cross sectional view of a silicon substrate with an oxide formed over the substrate and annulus and then patterned and etched to remove material over the annulus.

The systems and methods described herein may be particularly applicable to microelectromechanical devices, wherein the vias may be required to be very low loss or when the device is small. MEMS devices are often fabricated on a composite silicon-on-insulator wafer, consisting of a relatively thick (about 675 μm) "handle" layer of silicon overcoated with a thin (about 1 μm) layer of silicon dioxide, and covered with a silicon "device" layer. The MEMS device is made by forming moveable features in the device layer by, for example, deep reactive ion etching (DRIE) with the silicon dioxide layer forming a convenient etch stop. The movable feature is then freed by, for example, wet etching the silicon dioxide layer from beneath the moveable feature.

Alternately, MEMS devices can be fabricated on a thin silicon wafer by depositing and etching thin solid layers of metals and non-metals. If one of these layers is a sacrificial layer, the MEMS device can be released by etching this sacrificial layer, thus freeing the device or feature to move. The moveable features may then be hermetically encapsulated in a cap or lid wafer, which is bonded or otherwise adhered to the top of the silicon device layer, to protect the moveable features from damage from handling and/or to seal a particular gas in the device as a preferred environment for operation of the MEMS device.

The exemplary embodiment below is described with respect to an SOI substrate 100. The terms "first side" and "opposite side" are used herein to denote two generally parallel substrate surfaces, such as, for example, a top surface and a bottom surface of the SOI substrate. Alternative terms frequently used in the art are front side or frontside and back side or backside. Generally, the front side may have the smaller structural or functional features, and is often enclosed with a lid or other encapsulation. The backside often forms the outside of the package and may have electrical leads or vias formed therein. Accordingly, as used herein, the first side may be either the frontside or the backside, and the opposite side may be the obverse, parallel side. In one exemplary embodiment, the first side may be the device layer of an SOI substrate and the opposite side may be the handle layer. In another exemplary embodiment, the first side may be the handle layer and the opposite side the device layer. In either case, the opposite side is the obverse face of the substrate.

However, it should be understood that the systems and methods may be applied as well to a unitary silicon substrate. In this case, there is no handle layer, but the process steps are applied as described to the first side and opposite side of the unitary silicon substrate 100. Thus in this case as well, the method may be used to form a via which extends through the thickness of the silicon substrate, forming a through silicon via (TSV).

Through-hole vias are particularly convenient for MEMS devices, because they may allow electrical access to the encapsulated devices. Without such through holes, electrical access to the MEMS device may have to be gained by electrical leads routed under the capping wafer which is then hermetically sealed. It may be problematic, however, to achieve a hermetic seal over terrain that includes the electrical leads unless more complex and expensive processing steps are employed. This approach also makes radio-frequency applications of the device limited, as electromagnetic coupling will occur from the metallic bondline residing over the normally oriented leads. Alternatively, the electrical access may be achieved with through-wafer vias formed through the handle wafer, using the systems and methods described here.

The systems and methods described herein may be particularly applicable to vacuum encapsulated microelectromechanical (MEMS) devices, such as a MEMS actuator, switch, sensor, or infrared microdevice. However, they may also be applicable to any integrated circuit formed on a device wafer and encapsulated with a lid wafer. Examples of devices to which these techniques may be applicable can be found in, for example, U.S. Pat. No. 7,528,691 issued May 5, 2009, U.S. Pat. No. 7,893,798, issued Feb. 22, 2011, and U.S. Pat. No. 7,864,006, issued Jan. 4, 2011. Each of these patents is incorporated by reference in their entireties.

Figure 16:
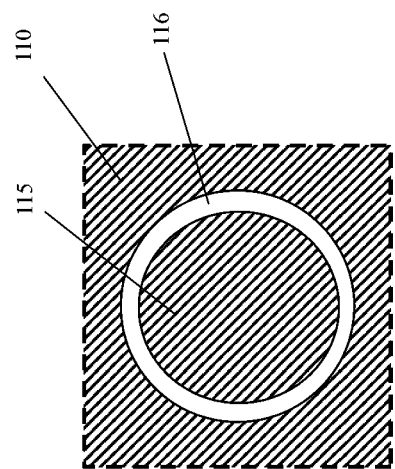
FIG. 16 is a plan view of a continuous annulus.
Figure 17:
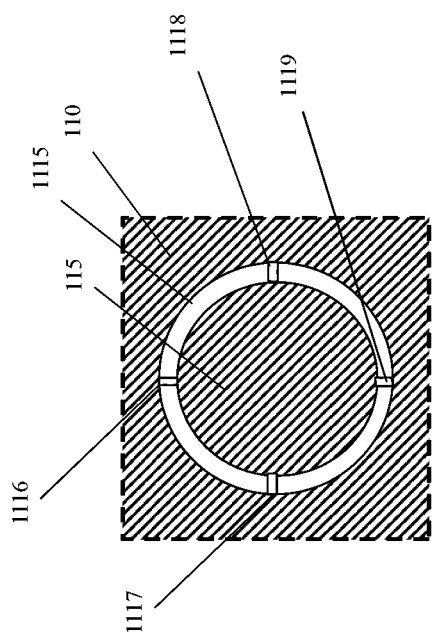
FIG. 17 is a plan view of a substantially continuous annulus with at least one tether.
Figure 18:
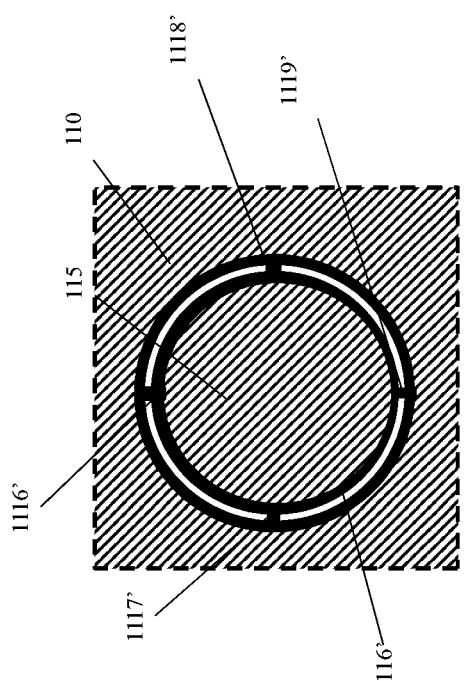
FIG. 18 is a plan view of another embodiment of a substantially continuous annulus with at least one tether after oxidation.

Exemplary embodiments are illustrated in FIGS. 1-15. An optional tethering system is illustrated in FIGS. 16-18. A flowchart of an exemplary method is given in FIG. 19.

FIG. 1 is a diagram of an exemplary silicon-on-insulator (SOI) substrate 100, having a device layer 110, a buried oxide layer 130 and a handle layer 120.

SOI wafers may come with a variety of dimensions, including some having a very thin device layer 110 on the order of 10 microns or less, typically used for integrated circuit fabrication. Other varieties may have a thin handle layer 120 on the order of 5 microns or less. An exemplary SOI wafer used for MEMS fabrication may have a device layer 110 about 250 microns thick and a handle layer about 450 microns thick, and a buried oxide on the order 3-5 microns thick. Such an SOI wafer may be appropriate for this process.

The device layer 110 may be single crystal or polycrystalline silicon of a thickness of, for example, 150 microns. The buried oxide 130 may be $SiO_2$ of a thickness of about 1-10 microns. The thickness of handle layer 120 may be chosen for convenience and may be several hundred microns thick, and may be polycrystalline silicon.

As used herein, the word "annulus" should be understood to mean a trench that circumscribes a post of material. The annulus and post may be, but are not necessarily, circular in shape. Instead, the post may be oval, oblate, trapezoidal, square, rectangular, for example, or any other shape. In each case, the "annulus" is a substantially continuous trench that circumscribes and defines the post, a described further below. The term "substantially continuous annulus" should be understood to mean a trench that exists around at least 75% of the perimeter of the post, and includes the case of the continuous annulus which completely circumscribes the post.

In the first step of the process, an annulus 115 is etched into a first side of the SOI substrate, here the silicon device layer 110. The annulus 115 may be formed down to the buried oxide 130, using Deep Reactive Ion Etching (DRIE) a technique well known in the industry. DRIE is capable of making holes or trenches with an aspect ratio of at least about 10 and at most about 50. Therefore, an annulus having dimensions of 10 microns in a 150 micron device layer is well within the capabilities of the technique. The diameter of the annulus will determine the width of the via, and may be chosen with this in mind. In the embodiment described here, the annulus may have any width from about 5 to about 100 microns. In a particular embodiment, the annulus, or more specifically, the post formed by the annulus 115, may have a diameter of about 50-75 microns, and the width between the walls of the annulus have a dimension of less than about 5 microns. That is, the trench of the annulus may have a width of less than about 5 microns and a depth of several hundred microns, for an aspect ratio of around 33. Most typically, the width of the trench may be about 3 microns and the depth about 100 microns. Reference number 115 should be understood to refer either to the annulus or to the post defined by the annulus.

Accordingly, forming the annulus comprises forming the annulus to a depth that is less than the thickness of the substrate material, such that the annulus is a blind hole. The annulus may be formed using deep reactive ion etching, forming a trench with an aspect ratio of at least 10 and no more than about 50.

When the silicon substrate is a silicon-on-insulator (SOI) substrate 100, the annulus may be formed in the front side of the SOI substrate, which may be the device layer 110 of the silicon-on-insulator substrate. Accordingly, for an SOI substrate, forming the annulus may comprise forming the annulus to a depth that is a thickness of the device layer of the silicon-on-insulator substrate, such that the annulus extends completely through the device layer. For other substrates such as a unitary silicon substrate, the annulus may be formed as a blind trench into the first side of the silicon substrate.

After formation of the annulus 115, the SOI substrate 100 may be oxidized. In one embodiment, a thermal oxide 117 of $SiO_2$ is grown on all of the exposed silicon surfaces. As is well known in the art, this thermal oxide may be formed by heating the substrate 100 in a furnace at 800-1200C for a period of several days. Accordingly, the thermal oxide may be formed over the silicon substrate, on the surfaces of the substrate and within the annulus, to a thickness of several microns, but generally less than 5 microns.

Figure 2B:
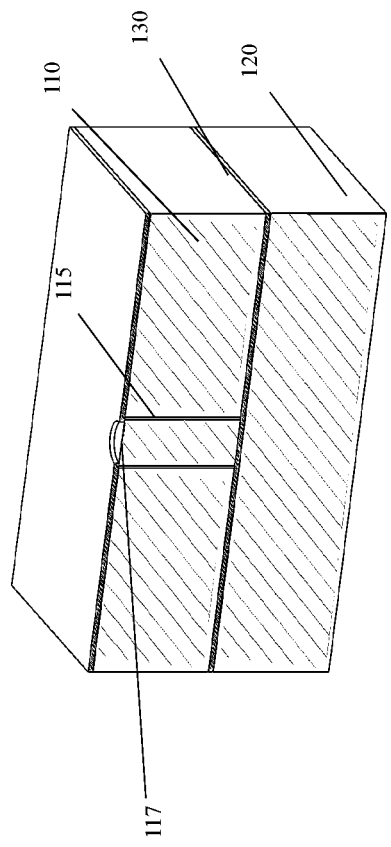
FIG. 2b is a perspective view of a silicon substrate with an oxide formed over the substrate and annulus and then patterned and etched to remove material over the annulus.

The oxide may then be removed above the annulus, to expose the top of the silicon post as shown most clearly in FIG. 2b. The oxide removal may be accomplished by etching through a photomask, as is known in the art. A wet or dry chemical etch may be effective in removing the oxide from the patterned surface.

The condition of substrate 100 is now as shown in FIG. 2b. A post of silicon 115 is surrounded by an oxide wall 117, and exposed and bare on top.

Figure 3A:
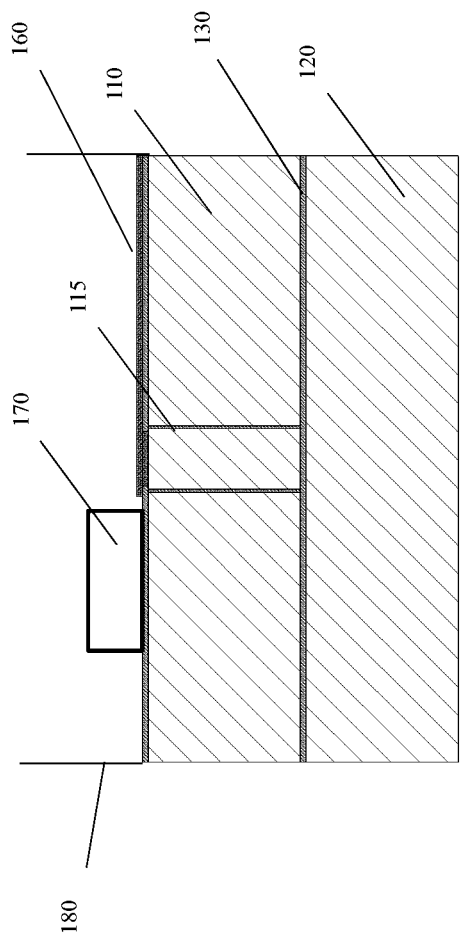
FIG. 3a is a cross sectional view of a silicon substrate with a metal pattern formed over the oxide and annulus.
Figure 3B:
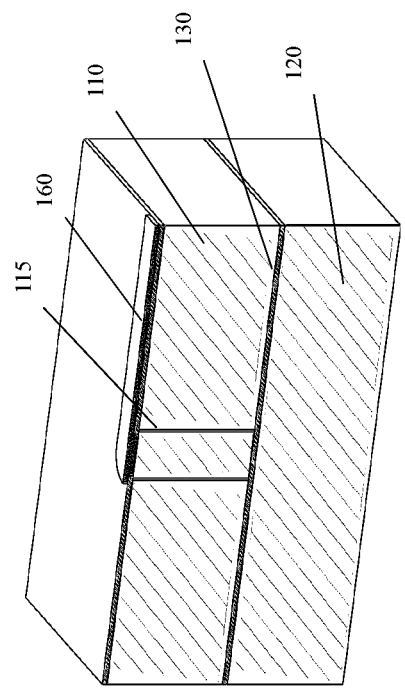
FIG. 3b is a perspective view of a silicon substrate with the metal pattern formed over the oxide and annulus.

The next step, illustrated in FIGS. 3a and 3b, may be the formation of an electrical pattern 160 on the first side of the SOI substrate 100. The metal pattern may be deposited by sputtering through a lithographic mask, or sputtering and then patterning and etching the metal to create the desired pattern. The deposited metal layer may be, for example, copper (Cu), gold (Au), aluminum (Al), or a copper alloy. The thickness of the metal layer 160 may be anywhere from 0.5 microns to about 5 microns or thicker. The metal layer 160 may be deposited with an optional adhesion or barrier layer such as titanium (Ti), chrome (Cr) or titanium/tungsten (TiW). The adhesion layer may be for example, about 0.01 microns thick.

Accordingly, in the next step, a metal layer may be formed, wherein forming the metal layer comprises forming an adhesion layer over the front side of the silicon substrate, and forming a pattern layer of metal material over the adhesion layer. If the silicon substrate is an SOI substrate, the metal layer may be formed on the device layer 110. If a unitary silicon substrate, the metal layer may be formed on the first side into which the blind annulus was formed.

Any other front side processing may occur at this step as well. For example, any additional structures, actuators, switches, sensors that will constitute or be included in the device may be fabricated on this first side of the SOI substrate 100 at this point. The structures may be of the MEMS sort or the integrated circuit sort. The structures may be, for example, a CMOS device. Since these structures depend on the application, they are not shown in the figures. However, it should be understood that additional features may be formed on the first side of the SOI substrate 100. The additional features are shown generically in FIG. 3a, as reference number 170. Therefore, it should be understood that the additional features 170 may be at least one of a MEMS device, and an integrated circuit device formed on the first side of the silicon substrate 100. Accordingly, the method may include forming an active device on the first side of the silicon substrate, wherein the active device comprises at least one of an integrated circuit, a MEMS device, a switch, a sensor and an actuator.

A design consideration is that the metal layer 160 be formed of sufficient thickness to have sufficient mechanical strength to act as an unsupported membrane. That is, the area directly above metal layer 160 may be an evacuated cavity. Therefore, depending on the dimensions of the structures, the metal layer 160 may be required to span an opening with vacuum on one side and atmosphere on the other. Accordingly, it should preferably be made with a thickness sufficient to withstand this force without rupturing. Accordingly, forming a metal layer over the annulus comprises forming a metal layer using at least one of sputter deposition, evaporation, or plating, and forming the metal layer to a thickness that can withstand a pressure vacuum on one side and atmospheric pressure on the other.

The metal pattern 160 may be used to deliver a signal or a voltage between the first side and the opposite side of the silicon substrate 100. More generally, the TSVs may be used to provide a signal or voltage from the exterior of an enclosed device, to the enclosed device.

A lid wafer 180 may be bonded to the first side of the SOI wafer at this point, encapsulating all the structures formed on the first side. The lid wafer is shown generically as reference number 180 in FIG. 3a. Although for clarity of depiction, structures 170 and 180 are not shown throughout the remaining figures, they should be understood to be optionally there.

The next step of the process is illustrated in FIGS. 4a and 4b. In this step, the handle layer 120 may be removed from the SOI substrate 100 to expose the buried oxide 130. This step will expose the opposite side of the substrate for further processing, as described below.

The handle layer 120 may be removed by grasping the perimeter of the SOI substrate 100 in a fixture, and submerging the handle layer 120 in an etching bath.

The buried oxide 130 may be removed in the area beneath the silicon post 115. Because remove of the oxide in this area may require photolithographic masks and thin film processing, it may be convenient to have placed alignment marks or fiducials on the first side of device layer 110 of silicon substrate 100. These alignment marks may be, for example, trenches etched 3-5 microns deep in the first side of the substrate 100. Because these techniques are well known in the art, they are not depicted in detail in the figures. Having now removed the handle layer 120, these alignment marks may be imaged through the substrate, such that the location of the silicon post 115 is known with respect to the alignment marks. Having patterned the lithographic mask appropriately, the oxide layer adjacent to the post 115 may now be removed using standard etching procedures. This step completes the preparation of the opposite side surfaces.

Accordingly, in some embodiments when the silicon substrate is a silicon-on-insulator (SOI) substrate, and the front side of the silicon substrate may be the device layer of the silicon-on-insulator substrate, removing substrate material from the opposite side may comprise removing the handle layer from the silicon-on-insulator substrate. For other substrates such as a unitary silicon substrate, the opposite side silicon may be removed by etching or grinding to the level of the blind annulus that was formed in the first side. For still other embodiments, front side of the silicon substrate may be the handle layer of the silicon-on-insulator substrate, removing substrate material from the opposite side may comprise removing the device layer from the silicon-on-insulator substrate, as will be described further below.

Additional structures may now be added according to standard opposite side processing. These additional structures may include exemplary layers 190 and 195, as illustrated on FIGS. 4*a* and 4*b*, which may be, for example, metal patterns which will provide electrical access to the via 115. Accordingly, the metal patterns may be electrical traces, and additional bonding pads may be formed on the opposite side of the silicon substrate, before removing the silicon post which will be described next.

Figure 5A:
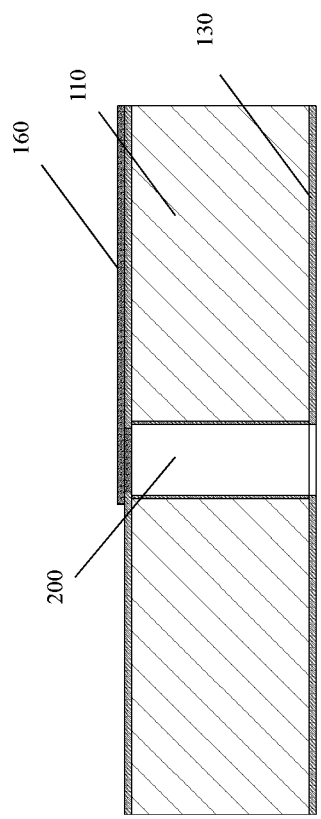
FIG. 5a is a cross sectional view of a silicon substrate with the silicon post removed from the annulus, leaving a via void.
Figure 5B:
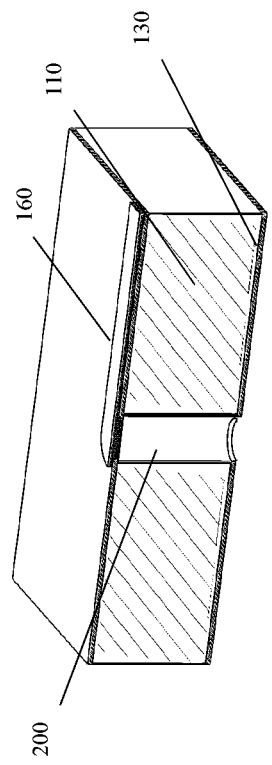
FIG. 5b is a perspective view of a silicon substrate with the silicon post removed from the annulus, leaving a via void.

FIGS. 5*a* and 5*b* illustrate the next step in the process, which is the removal of the silicon post 115 and its replacement with the metal via. The post 115 may be removed with DRIE for example. The DRIE may use the buried oxide layer 130 existing over most of the surface except the bottom of the silicon post 115 as a hard mask. The DRIE may then remove the material of the silicon post 115, which is now a via void 200. That is, there now remains a cylindrical void 200 in device layer 110.

A seed layer (not shown) may now be deposited conformally in the via void 200. In some cases, this thin layer of conductive material may be adequate for carrying voltage and current from the opposite side of the substrate to the first side. In other embodiments, the seed layer may be used to deposit additional metal material into the via void 200.

In the embodiment shown in FIG. 6*a*, the via void 200 is filled by plating metal material into the via void 200. This metal material may be, for example, gold (Au) or copper (Cu). The plated material may be deposited onto the seed layer described above, in addition to an optional adhesion layer or barrier layer. The adhesion layer may be, for example, chromium (Cr) or titanium (Ti). The adhesion, barrier or seed layers may be deposited by sputter, physical vapor deposition (PVD) for example, and may be about 0.1 microns thick. This deposition may then be followed by the formation of a conductive material in the via void 200, as described further below. It should be understood that any barrier layers, seed layers, and/or adhesion layers may be optional, and may depend on the tools being used and the applications being targeted.

With the seed, barrier or adhesion layers in place, the void may be filled with a conductive material 300. If the material is plated, the plating process may slightly overfill the via void 200, such that material is deposited beyond the opposite side surface of the substrate. The extra material may be removed by chemical mechanical polishing (CMP) to obtain a flush, planar surface. The finished condition of the substrate, now with vias extending through the thickness of the substrate, is shown in cross section in FIG. 6*a* and in perspective view in FIG. 6*b*. Accordingly, in one embodiment, depositing metal in the via hole may include forming a seed layer in the via hole and filling the via hole by plating metal onto the seed layer to fill the via hole. Depositing metal 300 in the via hole may comprise plating at least one of gold, copper, an alloy of copper and aluminum into the via hole, and removing any excess plated material with chemical mechanical polishing.

In another embodiment, the via hole may be filled with a solder material. A nozzle may be brought into the position of the via void 200 and a quantity of solder dispensed from the nozzle, as performed in bump bonding processes. Upon heating, the solder material may liquefy and flow into the via void 200. Upon contact with the relatively cool substrate surface, the solder material may freeze or solidify, filling the via void 200 and forming the conductive material of the through substrate via 300. Examples of appropriate solder materials may include:

SnAgCu
SnAg
PbSn 95/5, PbSn 90/10
AuSn 80/20
InSn
SnBi

Figure 7A:
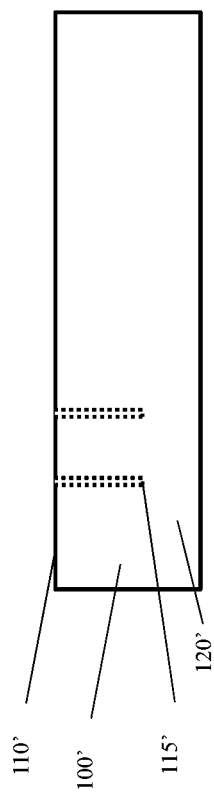
FIGS. 7a, 7b and 7c are a cross sectional views of a unitary silicon substrate and through substrate vias, processed with the method described herein.
Figure 7B:
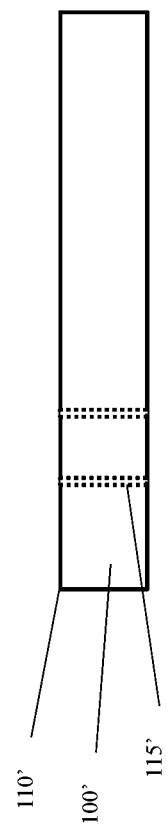
Figure 7C:
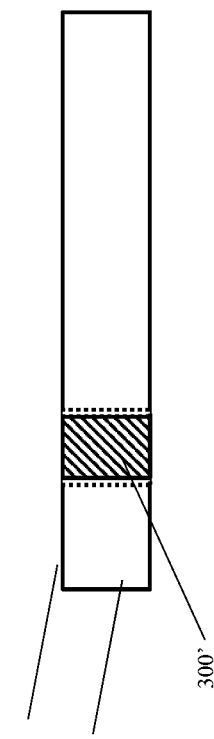

FIGS. 7*a*-7*c* depict the process as applied to a unitary silicon substrate 100'. In FIG. 7*a*, the annulus 115' in formed in the first side 110' of silicon substrate 100'. The surfaces may then be oxidized as described previously. In FIG. 7*b*, the opposite side 120' of the silicon substrate 100' is removed to the level of the annulus 115'. In FIG. 7*c*, the silicon post is removed and replaced with a conductive material 300' into the via void created by the removal of the silicon post. The conductive material 300' may be deposited by sputtering, plating or solder bumping, for example. Details as to the various processing steps may be similar or identical to those described previously with respect to the SOI embodiment illustrated by FIGS. 1-6*b*.

FIGS. 8-15 illustrate a second embodiment of the systems and methods described here. As before, a silicon substrate may be an SOI wafer 1100, with a device layer 1110, an oxide layer 1130 and a handle layer 1120. As before, the SOI wafer may have a device layer 1110 about 250 microns thick and a handle layer 1130 about 450 microns thick, and a buried oxide 1120 on the order 3-5 microns thick.

In this embodiment, the annulus 1125 may etched into the silicon handle layer 1120 rather than the device layer 1110. This step is illustrated in FIG. 8. The annulus 1125 may be formed down to the buried oxide 1130. As before, the annulus may be formed using Deep Reactive Ion Etching (DRIE) with an aspect ratio of at least about 10 and at most about 50. Therefore, an annulus having dimensions of 10 microns in a 150 micron handle layer is well within the capabilities of the technique. The diameter of the annulus will determine the width of the via, and may be chosen with this in mind. The annulus may have dimensions and aspect ratios as described above with respect to 115. Reference number 1125 should be understood to refer either to the annulus or to the post defined by the annulus.

Figure 9:
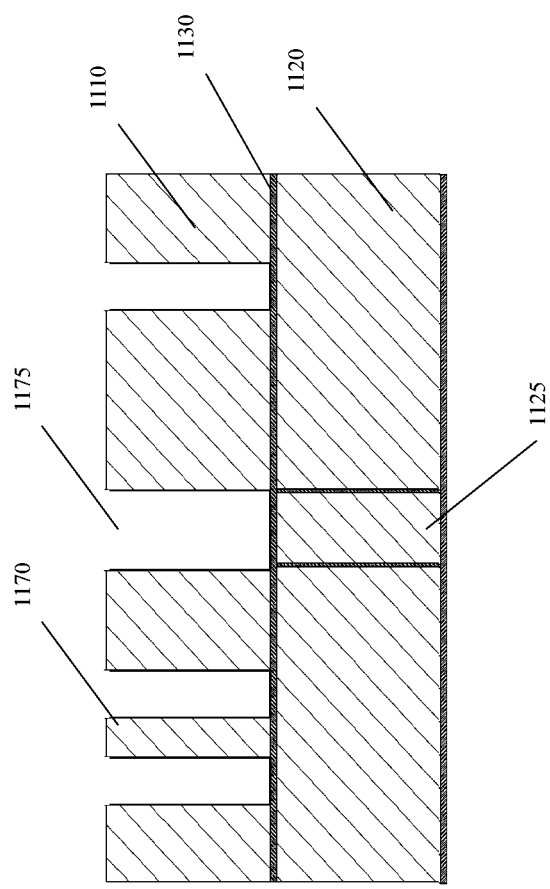
FIG. 9 is a cross sectional view of another embodiment of a silicon substrate with an annulus formed therein, with additional structural features formed on the opposite side from the annulus.

As shown in FIG. 9, additional features 1170 may then be formed in the device layer 1110. These features 1170 may include various MEMS or integrated circuit functional units, and are shown generically in FIG. 8. One such feature 1175 however, is formed directly over the annulus 1125 formed in the handle layer 1120. This feature 1175 may be a void extending to the buried oxide layer 1130. The other functional features 170 may be portions of a switch, actuator, sensor or other passive or active device. Any other front side processing may occur at this step as well. For example, any additional structures, actuators, switches, sensors that will constitute or be included in the device may be fabricated in the device layer 1110 of the SOI substrate 1100 at this point. The structures may be of the MEMS sort or the integrated circuit sort. The structures may be, for example, a CMOS device. Since these structures depend on the application, they are not shown in detail in the figures. However, it should be understood that additional features may be formed on the first side of the SOI substrate 1100.

Figure 10:
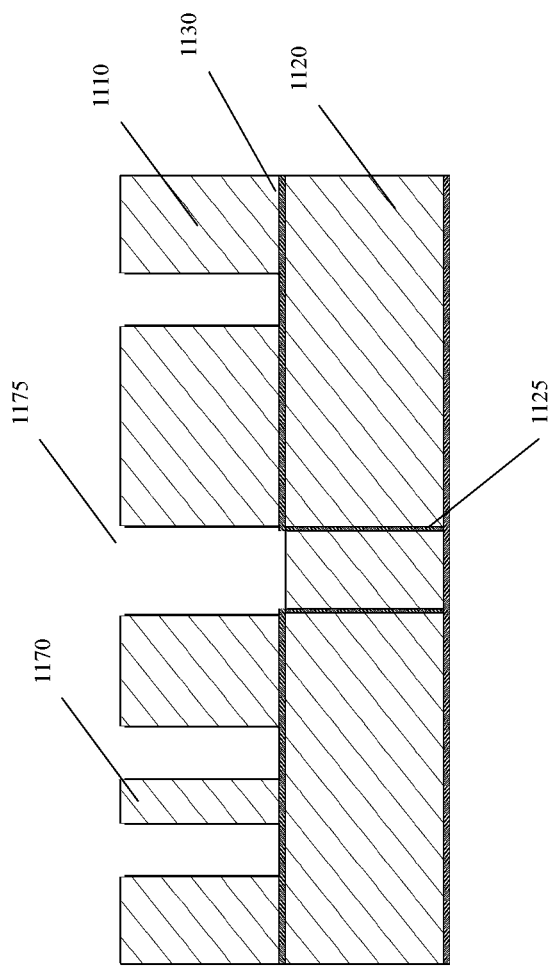
FIG. 10 is a cross sectional view of another embodiment of a silicon substrate with an oxide formed over the substrate and annulus and then patterned and etched to remove the oxide material over the annulus.

In FIG. 10, the buried oxide layer 1130 is removed directly above the annulus 1125, at the bottom of feature 175. This may or may not etch the oxide under all patterned structures 170. In FIG. 10 it is shown being removed only over the silicon via structure 1175. As before, the oxide 1130 may be removed to expose the top of the silicon post as shown in FIG. 10. The oxide removal may be accomplished by etching through a photomask, as is known in the art, and described previously with respect to 115. A wet or dry chemical etch may be effective in removing the oxide from the patterned surface.

Figure 11:
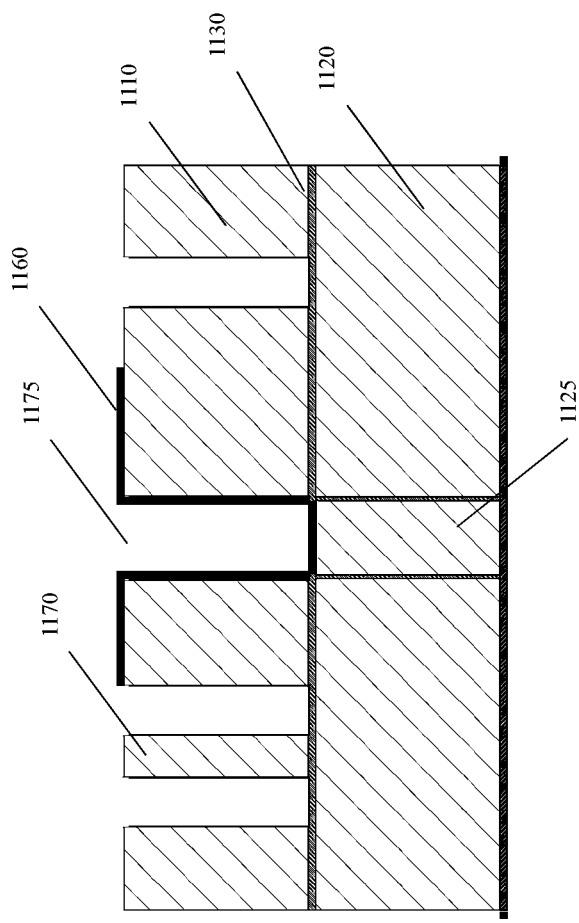
FIG. 11 is a cross sectional view of another embodiment of a silicon substrate with a metal pattern formed over the oxide and annulus.
Figure 12:
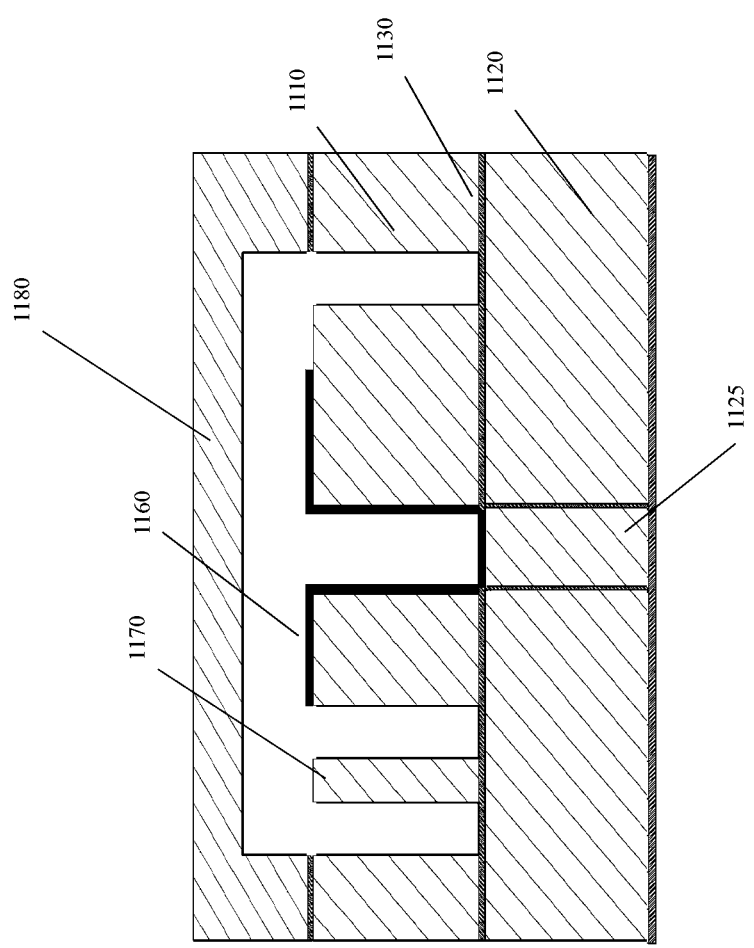
FIG. 12 is a cross sectional view of another embodiment of a silicon substrate with lid wafer affixed to the first side.
Figure 13:
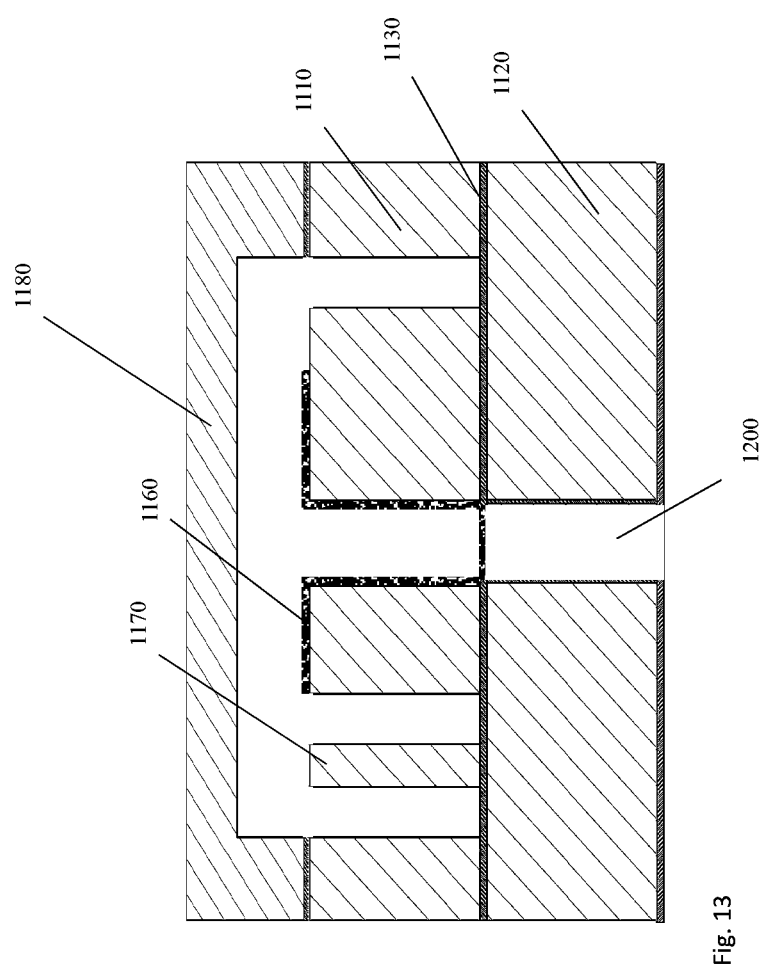
FIG. 13 is a cross sectional view of another embodiment of a silicon substrate with the silicon post removed from the annulus, leaving a via void.

In FIG. 11, a metal layer 1160 may be deposited conformally over the surface of the device layer 1110. This metal layer 1160 may provide interconnection between conductive features of the device 1170, as required by the application. The metal layer 1160 may be analogous to metal layer 160 in the first embodiment shown in FIG. 3.

As before, the metal layer 1160 may be deposited by sputtering through a lithographic mask, or sputtering and then patterning and etching the metal to create the desired pattern. The deposited metal layer 1160 may be, for example, copper (Cu), gold (Au), aluminum (Al), or a copper alloy. The dimensions and composition of the metal layer 1160 may be as described above with respect to metal layer 160.

In analogy with metal layer 160, a design consideration is that the metal layer 1160 be formed of sufficient thickness to have sufficient mechanical strength to act as an unsupported membrane. That is, the area directly above metal layer 1160 may be an evacuated cavity. Therefore, depending on the dimensions of the structures, the metal layer 1160 may be required to span an opening with vacuum on one side and atmosphere on the other. Accordingly, it should preferably be made with a thickness sufficient to withstand this force without rupturing. Accordingly, forming a metal layer over the annulus comprises forming a metal layer using at least one of sputter deposition, evaporation, or plating, and forming the metal layer to a thickness that can withstand a pressure vacuum on one side and atmospheric pressure on the other.

The metal pattern 1160 may be used to deliver a signal or a voltage between the first side and the opposite side of the silicon substrate 1100. More generally, the TSVs may be used to provide a signal or voltage from the exterior of an enclosed device, to the enclosed device. Accordingly, the metal patterns 1160 may be electrical traces, and additional bonding pads may be formed on the this side of the silicon substrate.

A lid wafer 1180 may be bonded to the first side of the SOI wafer at this point, encapsulating all the structures formed on the first side. The lid wafer is shown generically as reference number 1180 in FIG. 12.

If the substrate 1100 was thermally oxidized as was substrate 100, there may be another layer of oxide 1130 on the lower surface of the annulus and handle layer 1120. This oxide 1130 may be removed in this area beneath the silicon post 1125 using a process similar or identical to that described above with respect to oxide layer 130. Because these process details were mentioned previously, they are not repeated here.

Figure 14:
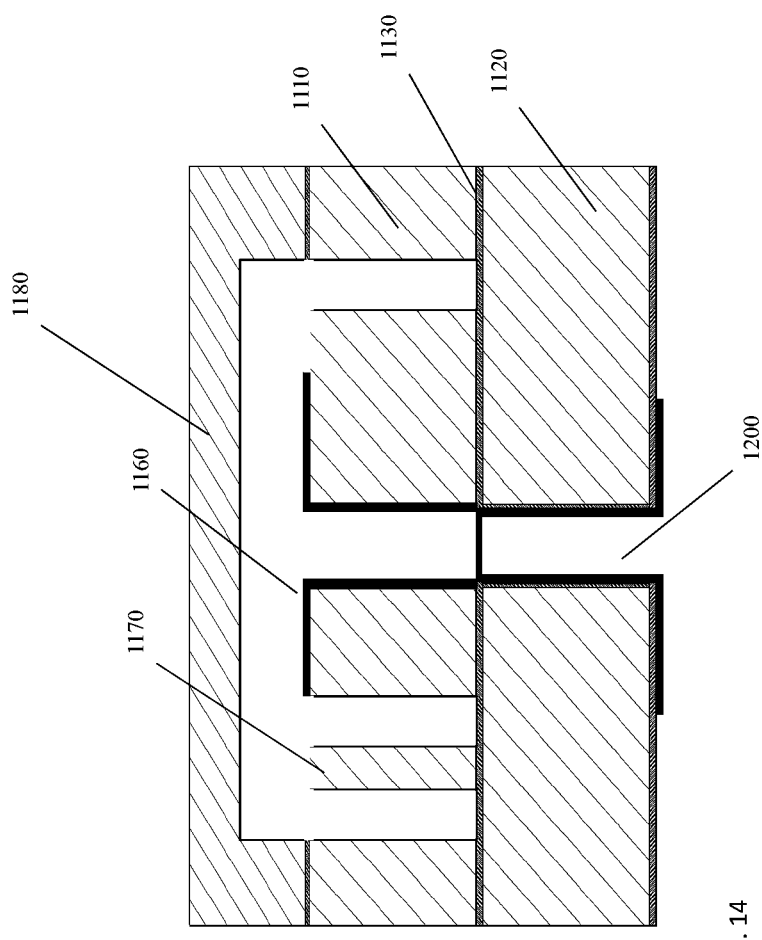
FIG. 14 is a cross sectional view of another embodiment of a silicon substrate with a seed layer deposited in the via void.

FIG. 14 illustrates the next step in the process, which is the removal of the silicon post 1125 and its replacement with the metal via. The post 1125 may be removed with DRIE for example. The DRIE may use the oxide layer 130 existing over most of the surface except the bottom of the silicon post 1125 as a hard mask. The DRIE may then remove the material of the silicon post 1125, which is now a via void 1200. That is, there now remains a cylindrical void 1200 in handle layer 1120.

A seed layer 1210 may now be deposited conformally in the via void 1200. As before, this thin layer of conductive material may be adequate for carrying voltage and current from the opposite side of the substrate to the first side. In other embodiments, the seed layer 1210 may be used to deposit additional metal material into the via void 1200. The seed layer 1210 is shown in FIG. 14.

Figure 15:
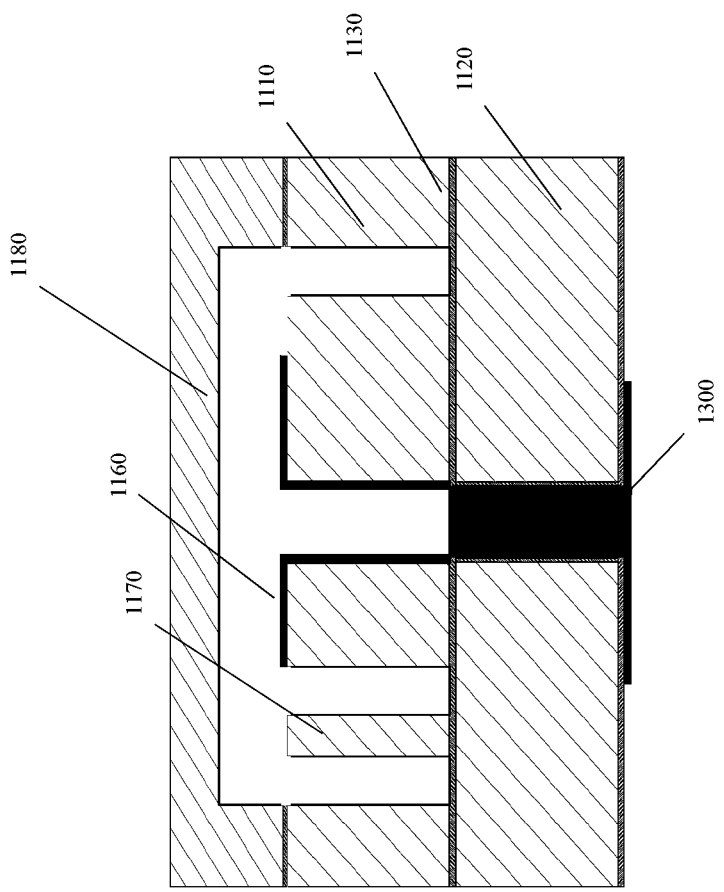
FIG. 15 is a cross sectional view of another embodiment of a silicon substrate with the via void filled with a conductive material.

In the embodiment shown in FIG. 15, the via void 1200 is filled by plating metal material 1300 into the via void 1200. This metal material 1300 may be, for example, gold (Au) or copper (Cu). The plated material may be deposited onto the seed layer described above, in addition to an optional adhesion layer or barrier layer. The adhesion layer may be, for example, chromium (Cr) or titanium (Ti). The adhesion, barrier or seed layers may be deposited by sputter, physical vapor deposition (PVD) for example, and may be about 0.1 microns thick. This deposition may then be followed by the formation of a conductive material in the via void 1200, as described further below. It should be understood that any barrier layers, seed layers, and/or adhesion layers may be optional, and may depend on the tools being used and the applications being targeted. These additional or optional layers may be understood to be included in layer 1210.

With the seed, barrier or adhesion layers 1210 in place, the void may be filled with a conductive material 1300. If the material 1300 is plated, the plating process may slightly overfill the via void 1200, such that material 1300 is deposited beyond the opposite side surface of the substrate. The extra material may be removed by chemical mechanical polishing (CMP) to obtain a flush, planar surface. The finished condition of the substrate, now with vias extending through the thickness of the substrate, is shown in cross section in FIG. 15.

FIGS. 16-18 are a simplified schematic illustrations of an optional feature which may be used in conjunction with the systems and methods presented here. FIG. 16 show a continuous annulus 116 which completely circumscribes the resulting post 115 as was shown previously. This is the embodiment that is discussed in relation to FIGS. 1-15 above. FIG. 17 depicts an alternative to the continuous annulus 115 of FIG. 16. FIG. 17 shows a substantially continuous annulus 1115, which is similar to 116 except that the annulus is interrupted by at least one isthmus of material that tethers the post 115 to the remainder of the substrate 110. Although FIG. 17 shows four such tethers, 1116, 1117, 1118 and 1119, it should be understood that this is exemplary only, and that there may be other numbers of tethers. The purpose of the tethers is to secure the post 115 to the substrate 110 when the other silicon or silicon dioxide is removed. Accordingly, there may be one tether or two, separated perhaps by 180 degrees, or three tethers in a plane, or any number of tethers, but at least one tether which couples the post 115 to the substrate 110. Or there may be, as shown in FIG. 17, four tethers positioned about 90 degrees apart.

The tethers may be formed in the silicon substrate 110, and so may be oxidized during the oxidation step described above. Because the silicon tethers 1116, 1117, 1118 and 1119 would otherwise form a conductive short between the via and the substrate, it is important to choose the tether dimensions such that the silicon within them is completely oxidized, and is thus insulating. Accordingly, the tether features 1116, 1117, 1118 and 1119 may have a width of at least about 1 micron and up to about 20 microns when formed in the silicon 110 substrate, These dimensions may assure that the oxidation occurs completely through the tethers 1116, 1117, 1118 and 1119.

The tethers 1116, 1117, 1118 and 1119 may be formed in the same etching step in which the post 115 is formed, and the features 1116, 1117, 1118 and 1119 may simply be included in the mask layout. As mentioned, the features may be formed by Deep Reactive Ion Etching (DRIE), and such etching techniques in general may not yield perfectly vertical sidewalls. As a result, their shape may vary through the thickness of the substrate. In particular, because the etching step which forms the tether features 1116, 1117, 1118 and 1119 may form features which get smaller or disappear completely through the thickness of the substrate 110. This is acceptable in general, because even a narrow tether existing only near the top surface of the substrate 110 is sufficient to secure the post 115 to the substrate 110.

FIG. 18 shows the condition of the substrate 110 after the oxidation step described above. In particular, the patterned silicon substrate shown in FIG. 17 may be oxidized in a furnace at 800-1200C for a period of several days. Accordingly, the thermal oxide may be formed over the silicon substrate 110, and on the surfaces of the substrate, on the tethers 1116, 1117, 1118 and 1119 and within the annulus, to a thickness of several microns as shown in FIG. 18. This oxide may isolate the post 115 from the remainder of the substrate 110. Reference numbers 1116', 1117', 1118' and 1119' are intended to designate the oxidized tethers 1116, 1117, 1118 and 1119 that were shown in FIG. 17. These tethers 1116, 1117, 1118 and 1119 may be used in combination with any of the previously described embodiments, and the remainder of the processing steps may be as previously described.

Figure 19B:
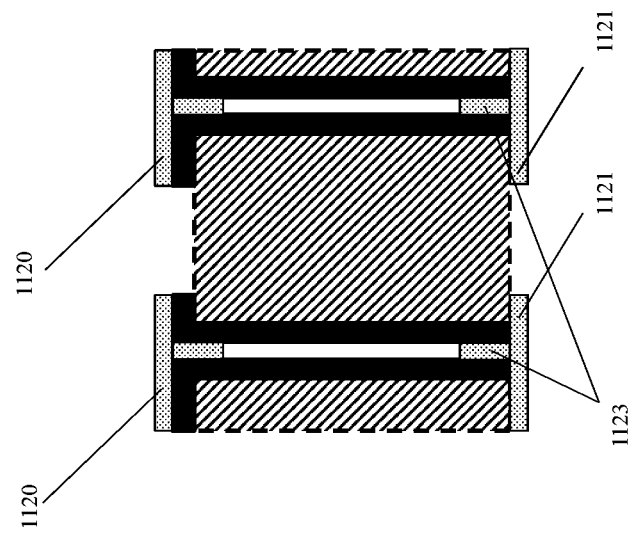
FIGS. 19a and 19b are a cross sectional views of another embodiment of a substantially continuous annulus with at least one tether in a tapered (a) and straight (b) shape.
Figure 19A:
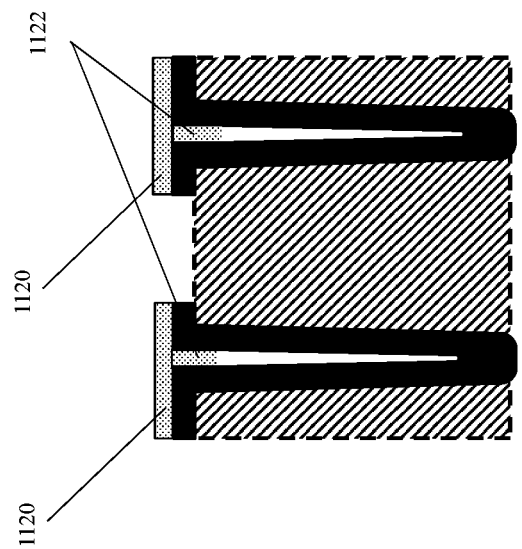

FIGS. 19*a* and 19*b* are cross sectional views of an alternative embodiment of the tethering system illustrated in FIGS. 17 and 18. In this embodiment, the substantially continuous annulus 1115 is formed as before, however, some additional insulating material 1120, 1121, 1122, 1123 may deposited over the substantially continuous annulus 1115. The insulating material may be any convenient material that can be patterned and adheres to the silicon and silicon dioxide surface. The material may be, for example, a nitride, oxide, a ceramic, or a polymer. As before, the purpose of the material is to bond the post to the rest of the silicon substrate. This material 1120, 1121, 1122, 1123 also fills the all the air gaps and prevents other substances from going into the air gaps during subsequent fabrication steps. FIG. 19*a* shows the condition of the post when the oxide is formed in the annulus from the remaining silicon. As described previously, the etching process may not create sidewalls which are perfectly vertical, but instead have a tapered shape. For this tapered shape, the oxide may still span the annular gap at the bottom of the annulus, but not at the top. In this situation, the additional, insulating material may be deposited over top of the annulus 1115 as shown. Accordingly, in this case, for the cross-sectional view shown in FIG. 19*a*, the trenches are tapered and only one side needs to be re-filled with the additional insulating material. It should be understood that this insulating material may be used in conjunction with either the annulus 116 or the substantially continuous annulus 1115.

FIG. 19*b* is a cross-sectional view of another embodiment, wherein an etching process is used which yields essentially vertical sidewalls. In this case, the trenches are straight and both sides could be re-filled (or not) with additional insulating materials. This insulating material may be formed on the top (1120, 1122) as well as on the bottom (1121, 1123) of the trenches. As shown in FIGS. 19*a* and 19*b*, the material over the annulus 1120 may be the same, or it may be different. Additional insulating material 1120, 1122 may be the same, or different, than additional insulating material 1121, 1123. It should be understood that insulating material 1120, 1121, 1122 and 1123 may take the place of silicon tethers 1116, 1117, 1118 and 1119, or they may be in addition to these silicon tethers.

Figure 20:
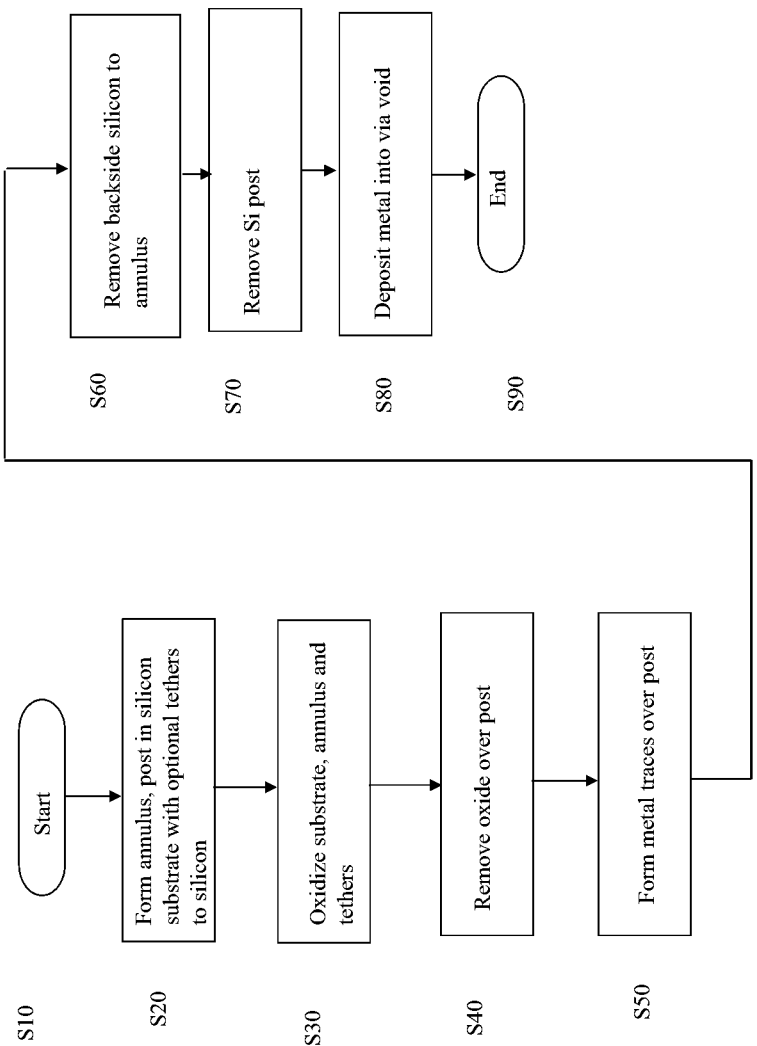
FIG. 20 is an exemplary flowchart illustrating the method.

An exemplary flowchart of the method is shown in FIG. 20. The method may begin in step S10 and proceed to step S20 wherein a substantially continuous annulus is formed in a silicon wafer, with at least one optional tether. The substantially continuous annulus may define a silicon post in the silicon substrate. In step S30, the silicon wafer, including the substantially continuous annulus, is covered with an oxide. The oxide may be a thermal oxide. In step S40, the oxide is removed over the silicon post. In step S50, at least one metal pattern is formed over the silicon post. In step S60, the opposite side silicon is removed, to the level of the substantially continuous annulus. In step S70, the silicon post is removed, leaving a via void. In step S80, a conductive material is deposited in the via void. The method ends in step S90.

It should be understood that this process shown in FIG. 20 is exemplary only, and that steps can be added or omitted, or performed in a different order than that shown without deviating from the scope of this invention. For example, if the silicon post has acceptable conductivity for the particular application, it need not be removed and replaced with another metal. It should also be understood that as described above, the via voids may be filled with any number of filler materials, including conductive materials such as copper.

The process described above may have some of the attributes of both "via-first" and "via-last" approaches. These terms may refer to the order in which vias are formed relative to other more complex or costly features. In via-first processing, the relatively low-cost, high yielding process is performed up front, before other more costly and complex procedures. Generally, via first processing requires the metal layers that are an integral part of the vias, to be formed up front. Because these metal layers are not robust with respect to high processing temperatures and aggressive chemistries, via-first methods limit what downstream process steps may subsequently be performed because of the early presence of these metal layers. The process described above may improve on via first approaches, because while some via features may be formed early in the process, the actual formation of the metal via structure is delayed until essentially all other structures have been formed.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure.

What is claimed is:

1. A method for forming a through substrate via, comprising:
    forming a silicon post by forming a void in the shape of a substantially continuous annulus in a first side of a silicon substrate, wherein the substantially continuous annulus is interrupted by at least one tether which connects the silicon post to the silicon substrate;
    forming an oxide on the silicon substrate, on the at least one tether and in the void;
    removing the oxide over the substantially continuous annulus;
    forming a metal layer over the substantially continuous annulus;
    removing the silicon substrate material from an opposite side to reach the substantially continuous annulus;
    removing the silicon post to form a via void; and
    depositing a metal material in the via void to form the through substrate via.

2. The method of claim 1, wherein the silicon substrate is a silicon-on-insulator substrate, wherein the first side of the silicon substrate is a device layer of the silicon-on-insulator substrate, and the opposite side is a handle layer, and wherein removing the silicon substrate material from the opposite side comprises removing a handle layer from the silicon-on-insulator substrate.

3. The method of claim 1, wherein the silicon substrate is a silicon-on-insulator substrate, wherein the first side of the silicon substrate is a handle layer of the silicon-on-insulator substrate and the opposite side is a device layer, and wherein removing the silicon substrate material from the opposite side comprises removing a device layer from the silicon-on-insulator substrate.

4. The method of claim 1, wherein forming the metal layer comprises forming an adhesion layer over the first side of the silicon substrate, and forming a pattern layer of the metal material over the adhesion layer.

5. The method of claim 1, further comprising forming at least one of a sensor, an actuator, and a switch on at least one of the first side and the opposite side of the silicon substrate.

6. The method of claim 1, further comprising bonding a lid wafer to at least one of the first side and the opposite side of the silicon substrate.

7. The method of claim 1, oxidizing the silicon substrate comprises forming a thermal oxide over the silicon substrate, on surfaces of the silicon substrate and within the substantially continuous annulus.

8. The method of claim 1, further comprising forming additional metal patterns and bonding pads on the opposite side of the silicon substrate, before removing the silicon post.

9. The method of claim 1, further comprising:
   forming at least one of a MEMS device, and an integrated circuit device on at least one of the first side and the opposite side of the silicon substrate.

10. The method of claim 1, wherein depositing the metal material in the via void comprises:
    disposing a quantity of a solder over the via void; and melting the solder.

11. The method of claim 1, wherein depositing the metal material in the via void comprises:
    forming a seed layer in the via void; and
    plating the metal material onto the seed layer to fill the via void.

12. The method of claim 1, wherein forming the substantially continuous annulus comprises forming the substantially continuous annulus by etching a narrow trench into the silicon substrate, the trench having a width of about 5 microns and a depth of at least about 100 microns, and a post defined by the substantially continuous annulus having a diameter of about 50 microns.

13. The method of claim 12, wherein forming the substantially continuous annulus comprises forming the substantially continuous annulus to a depth that is less than the thickness of the silicon substrate material, such that the substantially continuous annulus is a blind hole.

14. The method of claim 12, wherein the silicon substrate is a silicon-on-insulator substrate, and wherein forming the substantially continuous annulus comprises forming the substantially continuous annulus to a depth that is a thickness of the device layer of the silicon-on-insulator substrate, such that the substantially continuous annulus extends completely through the device layer.

15. The method of claim 12, wherein the silicon substrate is a silicon-on-insulator substrate, and wherein forming the substantially continuous annulus comprises forming the substantially continuous annulus to a depth that is a thickness of the handle layer of the silicon-on-insulator substrate, such that the substantially continuous annulus extends completely through the handle layer.

16. The method of claim 10, wherein depositing the metal material in the via hole comprises plating at least one of gold, copper, an alloy of copper and aluminum into the via hole, and removing any excess plated material with chemical mechanical polishing.

17. The method of claim 1, wherein forming a metal layer over the substantially continuous annulus comprises forming a metal layer using at least one of sputter deposition, evaporation, or plating, and forming the metal layer to a thickness that can withstand a pressure vacuum on one side and atmospheric pressure on another side of the metal layer.

18. The method of claim 1, wherein forming the substantially continuous annulus comprises forming the substantially continuous annulus by deep reactive ion etching a trench with an aspect ratio of at least 10 and no more than about 50.

19. The method of claim 1, further comprising:
    patterning the oxide to expose the top of the silicon post.

20. The method of claim 1, wherein forming a metal layer over the substantially continuous annulus comprises patterning the metal layer to form a pattern for delivering a signal or a voltage between the first side and the opposite side of the silicon substrate.

21. The method of claim 1, wherein the at least one tether comprises at least one of silicon, nitride, or an oxide.

22. The method of claim 1, wherein the at least one tether comprises four tethers positioned about 90 degrees apart.

23. The method of claim 1, wherein the at least one tether has a width of at least about 1 microns and less than about 20 microns.

* * * * *